United States Patent [19]
Choi

[11] Patent Number: 5,783,499
[45] Date of Patent: Jul. 21, 1998

[54] METHOD FOR THE FABRICATION OF A SEMICONDUCTOR DEVICE

[75] Inventor: Yang Kyu Choi, Kyoungki-do, Rep. of Korea

[73] Assignee: Hyundai Electronics Industries Co., Ltd., Kyoungki-do, Rep. of Korea

[21] Appl. No.: 743,750

[22] Filed: Nov. 7, 1996

Related U.S. Application Data

[63] Continuation of Ser. No. 489,710, Jun. 13, 1995, abandoned.

[30] Foreign Application Priority Data

Jun. 30, 1994 [KR] Rep. of Korea .............. 94-15435

[51] Int. Cl.⁶ .................................................. H01L 21/31
[52] U.S. Cl. ............................ 438/787; 438/763; 438/778; 438/782; 438/624; 438/626
[58] Field of Search ........................ 437/195; 438/787, 438/761, 763, 778, 782, 624, 626

[56] References Cited

U.S. PATENT DOCUMENTS

| | | | |
|---|---|---|---|
| 4,464,459 | 8/1984 | Majima et al. | 437/195 |
| 4,536,951 | 8/1985 | Rhodes et al. | 437/195 |
| 5,192,714 | 3/1993 | Suguro et al. | 437/195 |
| 5,246,887 | 9/1993 | Yu | 438/761 |
| 5,382,545 | 1/1995 | Hong | 437/195 |
| 5,395,645 | 3/1995 | Kodera et al. | 438/787 |
| 5,444,015 | 8/1995 | Aitken et al. | 437/195 |
| 5,444,023 | 8/1995 | Homma | 437/195 |
| 5,504,040 | 4/1996 | Moslehi | 438/787 |
| 5,516,721 | 5/1996 | Galli et al. | 438/424 |
| 5,561,076 | 10/1996 | Yoshino | 438/787 |
| 5,578,531 | 11/1996 | Kodera et al. | 438/763 |
| 5,612,239 | 3/1997 | Lin et al. | 438/787 |
| 5,661,051 | 8/1997 | Yeh et al. | 438/787 |

*Primary Examiner*—Charles L. Bowers, Jr.
*Assistant Examiner*—Lynne A. Gurley
*Attorney, Agent, or Firm*—Gary M. Nath; Nath & Associates

[57] ABSTRACT

A structure of double level metal free of voids is fabricated by depositing an insulating layer on the planarized layer which results from the growth of selective oxide layers to the thickness of the first metal wirings in the presence of the photoresist film patterns that are used to form the first metal wirings on the lower oxide layer. In addition, a patterning step for a second metal layer deposited on the insulating layer can be carried out with ease by virtue of the planarized layer of the first metal wirings, giving rise to a significant increase in the production yield. Thus, it can be usefully applied for ultra large scale integration devices, which are under a design rule of less than 0.4 μm.

1 Claim, 2 Drawing Sheets

METHOD FOR THE FABRICATION OF A SEMICONDUCTOR DEVICE

This application is a Continuation of U.S. patent application Ser. No. 08/489,710, filed Jun. 13, 1995, now abandoned, the contents of which are incorporated herein in their entirety.

BACKGROUND OF THE INVENTION

1. Field of the Invention

The present invention relates, in general, to a method for fabricating a semiconductor device adopting a structure of multilayer metal wiring and, more particularly, to the high integration and the production yield of the semiconductor device.

2. Description of the Prior Art

A structure of double level metal adopted into a semiconductor device is conventionally fabricated by depositing a first metal layer on an insulating layer, etching the first metal layer by use of a metal wiring mask to form a first metal wiring, depositing a blanket planarization insulating film and depositing a second metal layer on the second metal layer. A significant disadvantage of these conventional process steps is that voids occur when a large aspect ratio is produced owing to deep grooves between the first metal wirings, deleteriously affecting the characteristics of the device. In addition, the insulating layer deposited on the first metal wiring is not completely planarized so that a patterning step for the second metal layer is very difficult to carry out, thereby lowering the production yield.

SUMMARY OF THE INVENTION

Accordingly, it is a principal object of the present invention to provide a method for fabricating a semiconductor device adopting a structure of multilayer metal wiring by growth of a selective oxide which avoids the aforementioned problems associated with the prior art.

It is another object of the present invention to provide a method for fabricating a semiconductor device adopting a structure of multilayer metal wiring which is free of voids.

It is a further object of the present invention to provide a fabrication method which is capable of contributing significantly to the high integration of devices

BRIEF DESCRIPTION OF THE DRAWINGS

The above objects and other advantages of the present invention will become more apparent by describing in detail the preferred embodiments of the present invention with reference to the attached drawings in which.

DETAILED DESCRIPTION OF THE PREFERRED EMBODIMENTS

Figure 1:
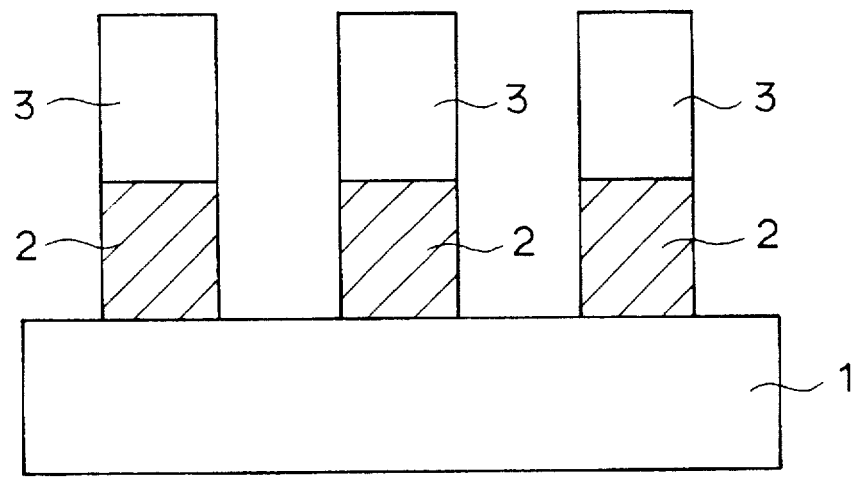
FIGS. 1 to 4 are schematic cross sectional views showing process steps of forming a structure of multilayer metal wiring in a semiconductor device, according to the present invention.

This application of the preferred embodiments of the present invention is best understood with reference to the accompanying drawings, wherein a structure of bilayer metal wiring is described and like reference numerals are used for like and corresponding parts, respectively.

The technology of the present invention is mainly related to a process in which a selective oxide layer is grown on the exposed lower oxide layer between first metal wirings to the thickness equal to the height of the first metal wirings. The selection oxide layer is only grown on the exposed lower oxide layer by a liquid phase deposition process. The chemical reaction of the selective oxide layer is:

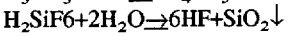

reaction temperature: 25°–50° C.

First, FIG. 1 shows first metal wirings 2 formed on a lower planarization oxide layer 1, an insulating layer on devices such as transistors (not shown) built on a semiconductor substrate (not shown). As seen in this figure, the first metal wirings 2 are made by etching a first metal layer deposited on the lower oxide layer 1, with photoresist film patterns 3 serving as a mask.

Figure 2:
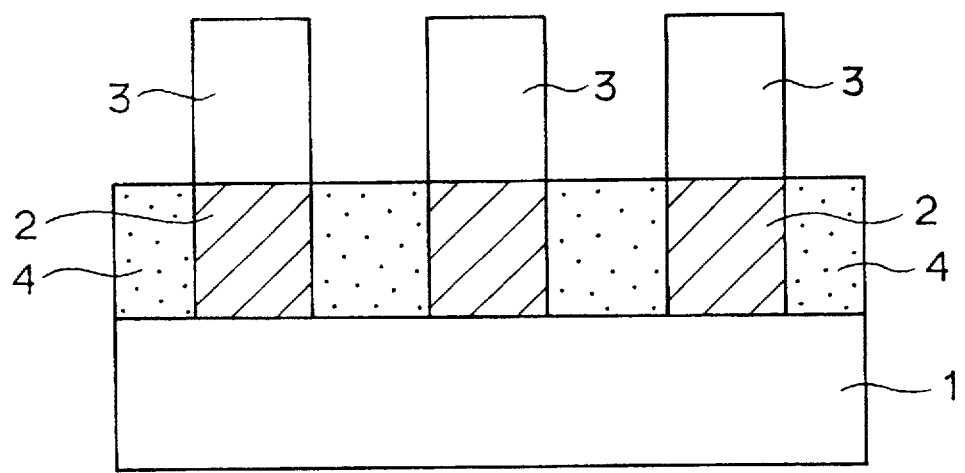

FIG. 2 is a cross section after selective oxide layers 4 grow on the exposed surfaces of the lower oxide layer, to the thickness equal to the height of the first metal wirings 2.

Figure 3:
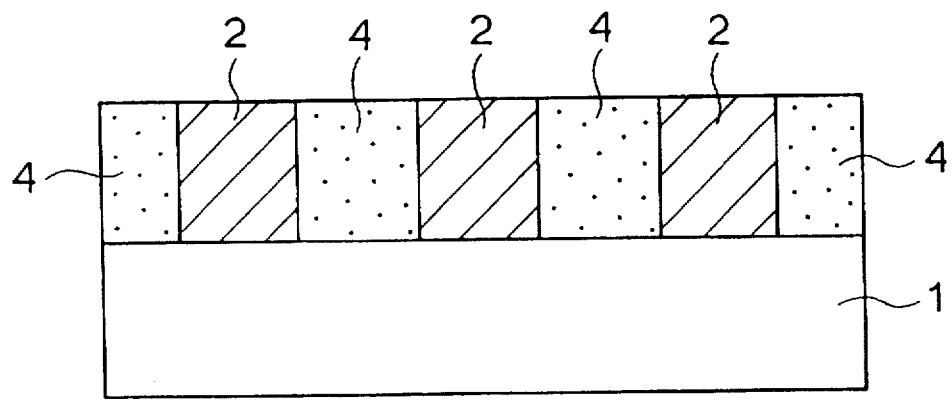

FIG. 3 is a cross section after the photoresist film patterns 3 are removed to obtain a planarized layer in which the selective oxide layers 4 alternate with the first metal wirings.

Figure 4:
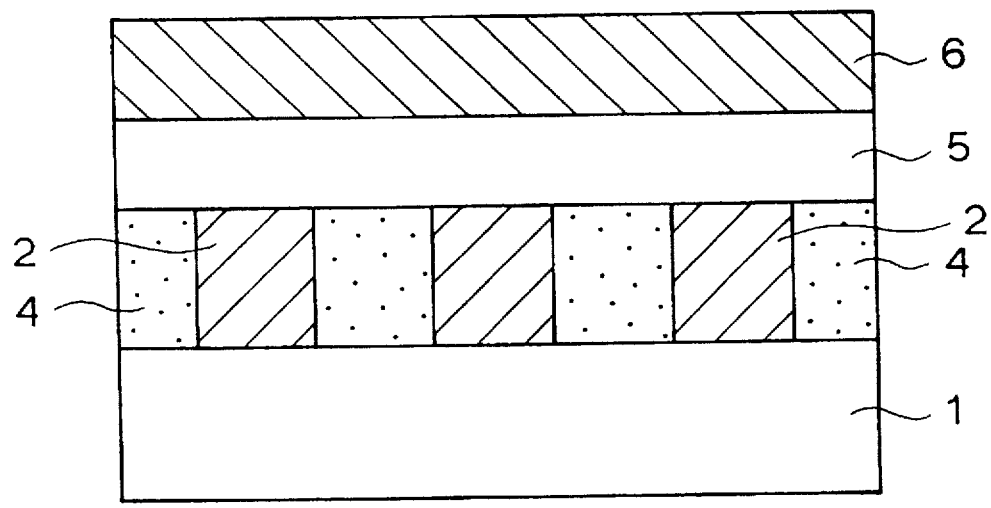

Finally, FIG. 4 is a cross section after an insulating layer 5 is deposited entirely on the planarized layer, followed by the deposition of a second metal layer 6 on the insulating layer 5.

As described hereinbefore, the voids are prevented from occurring in accordance with the present invention by depositing an insulating layer on the planarized layer which results from the growth of selective oxide layers to the thickness of the first metal wirings in the presence of the photoresist film patterns that are used to form the first metal wirings on the lower oxide layer. In addition, a patterning step for the second metal layer is allowed to be carried out with ease by virtue of the planarized layer of the first metal wirings, giving rise to a significant increase in the production yield. Thus, the present invention can be usefully applied for ultra large scale integration devices, which are under a design rule of less than 0.4 μm.

While the foregoing has described one technique for fabricating a semiconductor device adopting a structure of double level metal, it is envisioned that further equivalent configurations, modifications, and alternate embodiments may be suggested to those knowledgeable in the art. For example, the technique may be utilized to form a structure of tri-level metal and further multi-level metal by growing such selective oxide layers prior to the deposition of the metal layer. Accordingly, such alternate embodiments are to be construed as being within the spirit of the present invention, even though not explicitly set forth herein, the present invention being limited only by the content and scope of the claims appended hereto.

What is claimed is:

1. A method for fabricating a semiconductor device adopting a structure of multilayer metal wiring, comprising the steps of:

depositing a lower oxide layer on a transistor structure atop a semiconductor substrate;

depositing a first metal layer on the lower oxide layer and forming photoresist film patterns on the first metal layer;

etching the first metal layer with the photoresist film patterns serving as a mask, to form first metal wirings and to expose areas of the lower oxide layer;

selectively growing oxide layers on the exposed areas of the lower oxide layer between the first metal wirings to a thickness similar to the height of the first metal wirings by using a liquid phase deposition process resulting in a planarized structure;

removing the photoresist film patterns and depositing an insulating layer on the planarized resulting structure; and depositing a second metal layer on the insulating layer.

* * * * *